(12) United States Patent
Yarita et al.

(10) Patent No.: US 7,538,847 B2
(45) Date of Patent: May 26, 2009

(54) DISPLAY DEVICE AND MANUFACTURING METHOD THEREOF

(75) Inventors: Hiroyuki Yarita, Mobara (JP); Kikuo Ono, Mobara (JP)

(73) Assignee: Hitachi Displays, Ltd., Tokyo (JP)

( * ) Notice: Subject to any disclaimer, the term of this patent is extended or adjusted under 35 U.S.C. 154(b) by 0 days.

(21) Appl. No.: 12/078,126

(22) Filed: Mar. 27, 2008

(65) Prior Publication Data

US 2008/0186442 A1    Aug. 7, 2008

Related U.S. Application Data

(62) Division of application No. 11/080,884, filed on Mar. 16, 2005, now Pat. No. 7,369,205.

(30) Foreign Application Priority Data

Mar. 26, 2004   (JP) ............................. 2004-090793

(51) Int. Cl.
*G02F 1/1345* (2006.01)

(52) U.S. Cl. ........................ 349/149; 349/152; 349/187

(58) Field of Classification Search ...................... None
See application file for complete search history.

(56) References Cited

FOREIGN PATENT DOCUMENTS

JP    6-160881    11/1992

*Primary Examiner*—Richard H Kim
(74) *Attorney, Agent, or Firm*—Reed Smith LLP; Juan Carlos A. Marquez, Esq.

(57) ABSTRACT

A display device with a substrate, a terminal portion, and the terminal portion have at least a portion formed with a first transparent conductive film and a second transparent conductive film, and the first transparent conductive film is exposed from the second transparent conductive film at a part of the portion, and crystallinity of the first transparent conductive film is higher than that of the second transparent conductive film.

3 Claims, 8 Drawing Sheets

DISPLAY DEVICE AND MANUFACTURING METHOD THEREOF

CROSS-REFERENCE TO RELATED APPLICATION

This application is a Divisional application of U.S. application Ser. No. 11/080,884 filed Mar. 16, 2005 now U.S. Pat. No. 7,369,205. Priority is claimed based on U.S. application Ser. No. 11/080,884 filed Mar. 16, 2005, which claims the priority of Japanese Patent Application No. 2004-090793 filed on Mar. 26, 2004, all of which is incorporated by reference.

BACKGROUND OF THE INVENTION

1. Field of the Invention

The present invention relates to a display device, for example, a display device with improved terminal portions.

2. Description of the Related Art

A display device includes a large number of pixels on a display part thereof and signals are supplied to these respective pixels so as to independently perform the display control of these pixels. Accordingly, the number of terminals of respective signal lines which are led from the display part becomes extremely large and an area of terminal is extremely small.

In general, the terminal portions of the respective signal lines may be formed, in a state that the signal lines are covered with an insulation film, by forming holes in the insulation film so as to expose portions of surfaces of the signal lines.

However, when moisture or the like from outside air or the like is attached to the terminal portion, the moisture or the like forms an electrolyte and generates an electrolytic corrosion which performs an ionic exchange with other neighboring terminal portions whereby it is impossible to prevent the corrosion of the terminal portions.

Accordingly, there has been known the structure which covers the exposed portions of signal lines with a light transmitting conductive film such as ITO (Indium Tin Oxide), for example. Since such a light transmitting conductive film is an oxide, the film is a chemically stable material.

SUMMARY OF THE INVENTION

However, when the transmitting conductive film is formed on the terminal portions, it has been found out that the connection resistance is increased. With respect to the display device in recent years, the high definition of the display part has progressed in the display portion and, along with the increase of the number of terminals, the miniaturization of the area is enhanced and hence, the suppression of the increase of the electric resistance value has been a task which has to be overcome urgently.

The present invention has been made under such circumstances and an advantage of the present invention is to provide a display device with terminal portions which can reduce an electric resistance value of a surface thereof.

To briefly explain the summary of typical inventions among the inventions disclosed in this specification, they are as follows.

(1) The present invention is, for example, a display device with a substrate, a terminal portion, and the terminal portion have at least a portion formed with a first transparent conductive film and a second transparent conductive film, and the first transparent conductive film is exposed from the second transparent conductive film at a part of the portion, and crystallinity of the first transparent conductive film is higher than that of the second transparent conductive film.

(2) The display device according to the present invention is, for example, on the premise of the constitution (1), an insulation film formed between the second transparent conductive film and the first transparent conductive film.

(3) The display device according to the present invention is, for example, on the premise of the constitution (2), the signal lines which are formed below the insulation film are connected with the first transparent conductive film below the insulation film.

(4) The display device according to the present invention is, for example, on the premise of the constitution (3), the signal lines are formed in a state that the signal lines extend to at least a portion of an annular region which surrounds the opening formed in the insulation film.

(5) The display device according to the present invention is, for example, on the premise of the constitution (2), the insulation film is formed of a at least two-layered stacked body, the signal lines which are interposed between these layers extend to a side wall surface of the opening formed in the insulation film, and an extension end is electrically connected with the second transparent conductive film which is formed on the side wall surface of the opening.

(6) The display device according to the present invention is, for example, on the premise of the constitution (2) the insulation film is constituted of a at least two-layered stacked body, and in a region other than the terminal portions, a semiconductor layer is formed between the insulation film.

(7) The display device according to the present invention is, for example, on the premise of the constitution (1), first electrode for display and second electrode for display in a pixel, and one electrode of the first electrode for display and the second electrode for display is formed simultaneously at the time of forming the first conductive film, and another electrode of the first electrode for display and the second electrode for display is formed simultaneously at the time of forming the second conductive film, and a line width of the one electrode is set larger than a line width of the another electrode.

(8) The display device according to the present invention is, for example, on the premise of the constitution (2), first electrode for display and second electrode for display in a pixel, and the first electrode for display is same layer with the first conductive film, and the second electrode for display is same layer with the second conductive film, and a line width of the first electrode for display is set larger than a line width of the second electrode for display.

(9) The display device according to the present invention is, for example, on the premise of the constitution (8), the insulation film is formed between the first electrode for display and the second electrode for display.

(10) A manufacturing method of a display device according to the present invention is, for example, which comprises a step of forming a first transparent conductive film on a terminal portion forming region of a substrate;

forming a semiconductor layer on a region of the substrate other than the terminal portion forming region;

forming a second transparent conductive film by exposing a portion of the first transparent conductive film in the terminal portion forming region of the substrate; and performing a thermal treatment.

(11) The manufacturing method according to the present invention is, for example, on the premise of the constitution (10), the step in which the thermal treatment is performed is conducted also for an orientation film baking step.

Here, the present invention is not limited to the above-mentioned constitution and various modification can be made without departing from the gist of the present invention.

In the terminal portion having such a constitution, both of the first transparent conductive film and the second transparent conductive film which constitute conductive films are formed of a material which exhibits reliability against so-called electrolytic corrosion.

Here, with respect to the second transparent conductive film which constitutes an upper layer, to take the connection resistance between the second transparent conductive film and another electrode which is directly brought into contact with the second transparent conductive film into consideration, it is preferable to use a highly crystalline conductive film. This is because that the highly crystalline conductive film exhibits the low connection resistance. Here, being highly crystalline implies that the film is observed as having a large grain and large surface irregularities.

However, due to the reasons set forth below, the highly crystalline conductive film is used as the first transparent conductive film which is positioned below the second transparent conductive film and the second transparent conductive film is formed of a material having lower crystallinity than the first transparent conductive film. Here, having lower crystallinity implies that the film is observed as having a small grain and small surface irregularities.

Then, a portion of the region which functions as the terminal portion is configured to expose the first transparent conductive film from the second transparent conductive film and this exposed first transparent conductive film is arranged to contribute to the connection with other electrode.

On the other hand, since the second transparent conductive film which constitutes the upper layer is formed to possess the low crystallinity and hence, has the property that the second transparent conductive film is hardly peeled off thus providing the reliable constitution as the terminal portion and, at the same time, at the time of peeling off other electrode for repairing, for example, it is possible to obviate the occurrence of the rupture of the terminal portion.

Further, in forming the terminal portion of the display device, it is preferable that the semiconductor device such as a thin film transistor, for example, is formed between the first transparent conductive film and the second transparent conductive film and the second transparent conductive film is formed at a low temperature (In general, the other layers are also formed at the time of forming the second transparent conductive film and it is preferable that the second transparent conductive film does not impart a thermal effect to these layers). Accordingly, the second transparent conductive film is formed of the low crystalline conductive film which can be formed at a low temperature.

BRIEF DESCRIPTION OF THE DRAWINGS

FIG. 1A to FIG. 1C are views showing one embodiment of the constitution of a display device according to the present invention, wherein FIG. 1A is a plan view, FIG. 1B is a cross-sectional view taken along a line A-A' in FIG. 1A, and FIG. 1C is a cross-sectional view taken along a line B-B' in FIG. 1A;

FIG. 4A to FIG. 4D are views showing one embodiment of the constitution of the display device according to the present invention, wherein FIG. 4A is a plan view, FIG. 4B is a cross-sectional view taken along a line A-A' in FIG. 4A, FIG. 4C is a cross-sectional view taken along a line B-B' in FIG. 4A and FIG. 4D is a cross-sectional view taken along a line C-C' in FIG. 4A;

FIG. 5A and FIG. 5B are XRD graphs used in the terminal portion of the display device according to the present invention, wherein FIG. 5A is the XRD graph of a first transparent conductive film and FIG. 5B is the XRD graph of a second transparent conductive film;

FIG. 7A to FIG. 7C are views showing one embodiment of the constitution of a display device according to the present invention, wherein FIG. 7A is a plan view, FIG. 7B is a cross-sectional view taken along a line A-A' in FIG. 7A, and FIG. 7C is a cross-sectional view taken along a line B-B' in FIG. 7A;

FIG. 8A to FIG. 8C are views showing one embodiment of the constitution of a display device according to the present invention, wherein FIG. 8A is a plan view, FIG. 8B is a cross-sectional view taken along a line A-A' in FIG. 8A, and FIG. 8C is a cross-sectional view taken along a line B-B' in FIG. 8A.

DETAILED DESCRIPTION OF THE INVENTION

Embodiments of a display device according to the present invention are explained in conjunction with drawings hereinafter.

Embodiment

Figure 2:
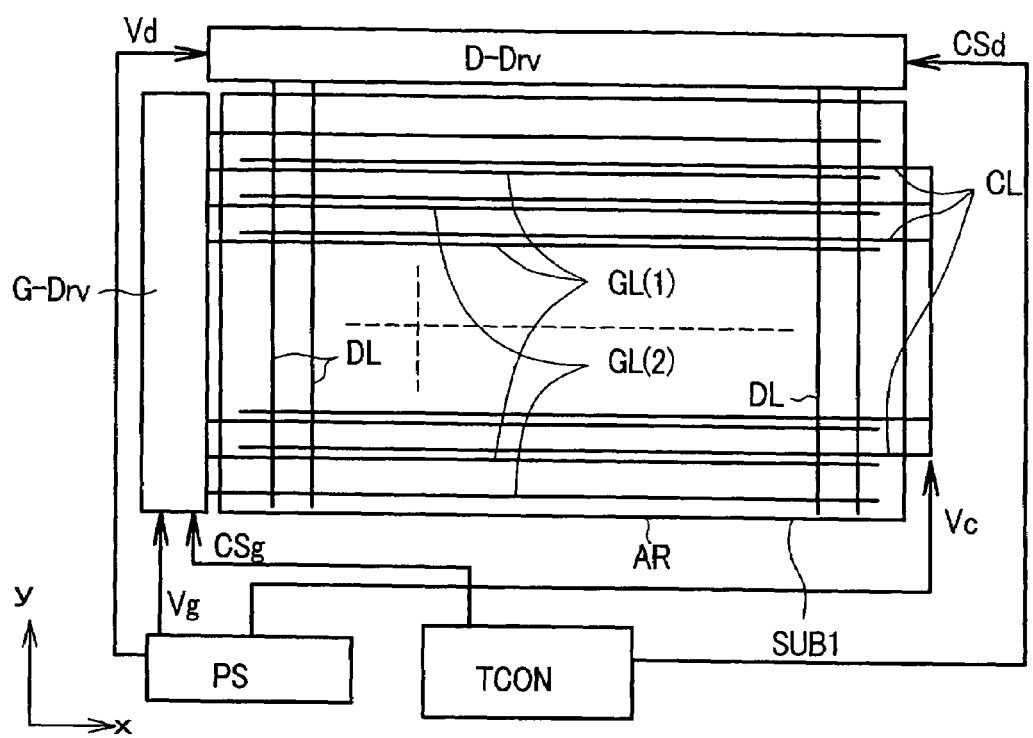
FIG. 2 is a plan view showing one embodiment of the whole constitution of the display device according to the present invention.

FIG. 2 is a schematic plan view showing one embodiment of the whole constitution of a liquid crystal display device according to the present invention. FIG. 2 also shows a circuit which is formed on a liquid-crystal-side surface of the transparent substrate SUB1 which is one of respective transparent substrates arranged to face each other in an opposed manner while sandwiching liquid crystal therebetween.

On a surface of the transparent substrate SUB1, respective regions which are surrounded by gate signal lines GL which extend in the x direction and are arranged in parallel in the y direction and drain signal lines DL which extend in the y direction and are arranged in parallel in the x direction constitute pixel regions and a mass of these pixel regions form a liquid crystal display part AR.

Although the detailed constitution of the pixel region will be described later, a counter voltage signal line CL is formed in a state that the counter voltage signal line CL runs through a group of pixels which are arranged in parallel in the x direction out of the respective pixel regions.

The counter voltage signal line CL is a signal line for supplying a voltage signal which becomes the reference for an image signal supplied to pixel electrodes PX in the inside of respective pixels.

To the above-mentioned respective gate signal lines GL, scanning signals are sequentially scanned and are supplied from a gate driver G-Drv and, in response to this scanning timing, image signals are supplied from a drain driver D-Drv to the respective drain signal lines DL.

Each pixel region includes a thin film transistor TFT which is turned on in response to the supply of the scanning signal from the gate signal line GL and a pixel electrode PX to which an image signal from the drain signal line DL is supplied through the thin film transistor. The image signal (voltage) which is supplied to this pixel electrode PX generates an electric field between the image signal and the counter voltage signal (voltage) which is supplied to the above-mentioned counter electrode CT thus controlling the optical modulation of the liquid crystal using this electric field.

Here, the gate driver G-Drv and the drain driver D-Drv supply the scanning signal and the image signal in response to a signal from a power circuit PS and a liquid crystal display control circuit TCON.

Figure 3A:
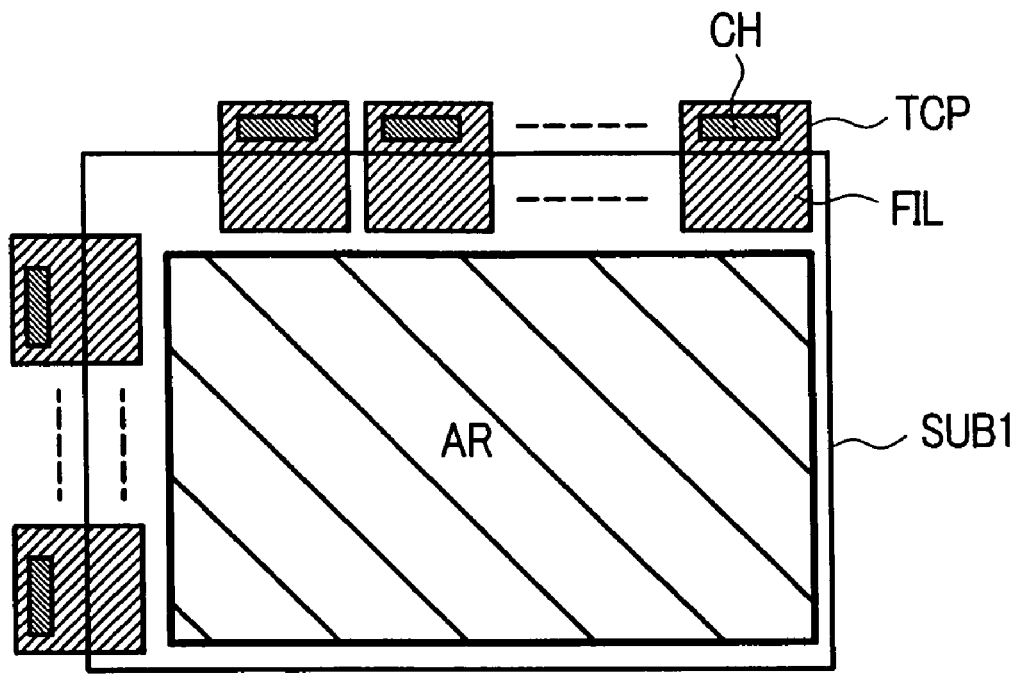
FIG. 3A and FIG. 3B are plan views showing embodiments of a driver connected to a terminal portion of the display device according to the present invention.
Figure 3B:
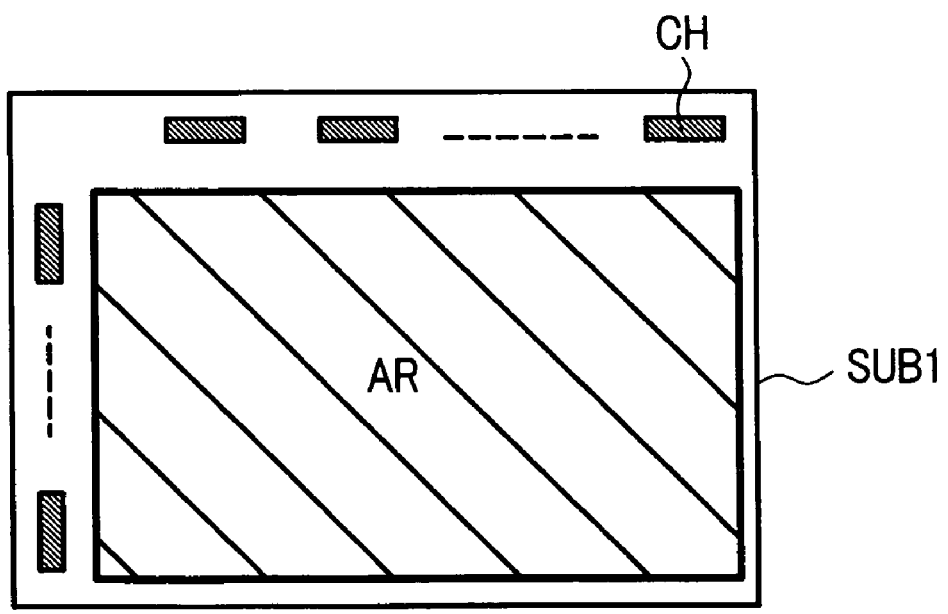

The above-mentioned gate driver G-Drv and the drain driver D-Drv may be constituted of, for example, as shown in FIG. 3A, a semiconductor device TCP which is formed in a so-called film carrier method in which the gate driver G-Drv and the drain driver D-Drv are respectively divided into a plurality of pieces and, as shown in FIG. 3B, the gate driver G-Drv and the drain driver D-Drv may also be constituted of a semiconductor device CH to which a chip is directly mounted.

Here, the semiconductor device TCP formed in the film carrier method is constituted such that the semiconductor device CH is mounted on the film FIL and is pulled out to the side of the film FIL by way of a wiring layer on which bump electrodes of the semiconductor device CH are formed on a surface of the film FIL.

However, in either constitution, these semiconductors TCP, CH are electrically connected and hence, on a front surface of the transparent substrate SUB1, terminal portions (FIG. 1) are respectively provided at extension end portions of the above-mentioned gate signal lines GL and the drain signal lines DL.

Figure 4A:
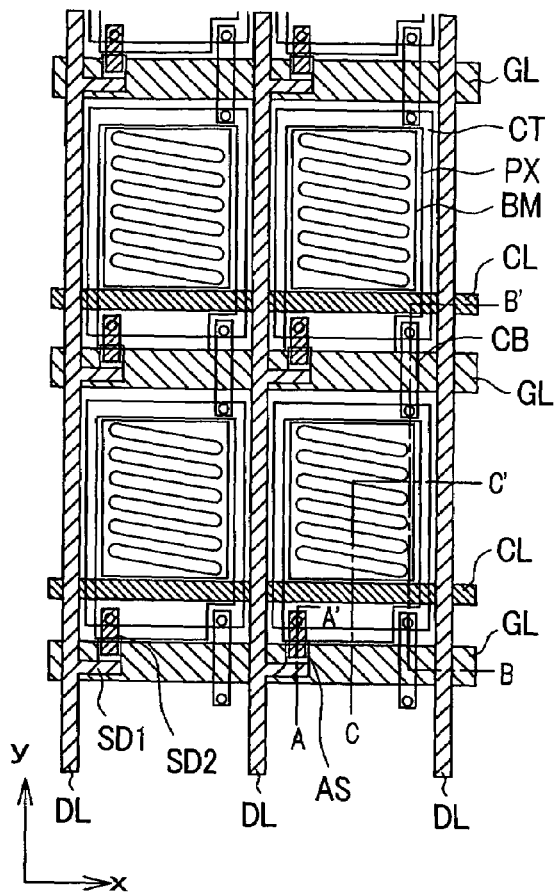

FIG. 4A is a plan view showing one embodiment of the constitution of the above-mentioned pixels arranged in a matrix array by sampling 2×2 pieces of pixels out of the respective pixels.

Figure 4B:
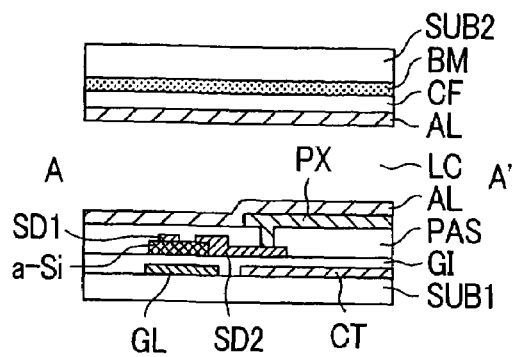
Figure 4D:
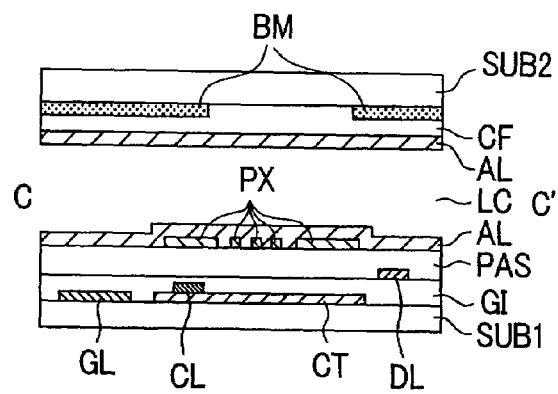
Figure 4C:
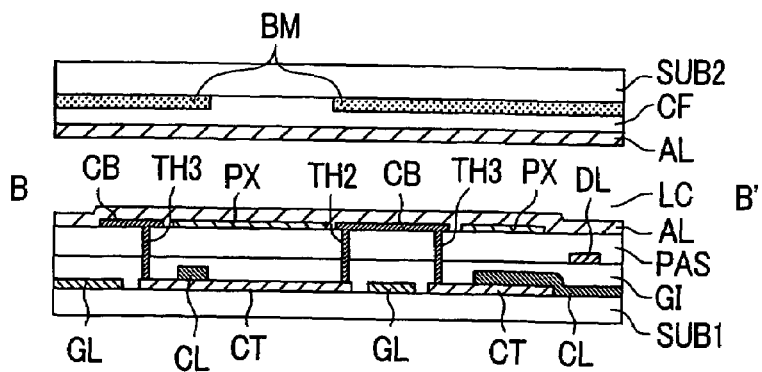

Further, respective cross-sectional views taken along lines A-A' B-B° C-C' in FIG. 4A are shown in FIG. 4B, FIG. 4C, FIG. 4D respectively.

On the liquid-crystal-side surface of the transparent substrate SUB1, gate signal lines GL which are extended in the x direction and are arranged in parallel in the y direction are formed.

These respective gate signal lines GL are arranged in such a manner that the gate signal lines GL surround rectangular regions together with the drain signal lines DL which are described later and these regions are constituted as the pixel regions.

A counter electrode CT is formed on each pixel region of the transparent substrate SUB1 and, this counter electrode CT is formed of a light transmitting conductive layer made of a material such as, for example, ITO (Indium Tin Oxide), ITZO (Indium Tin Zinc Oxide), IZO (Indium Zinc Oxide), $SnO_2$ (tin oxide), $In_2O_3$ (indium oxide) or the like and is formed in the whole central region except for a minute peripheral portion of the pixel region.

The light transmitting conductive layer which constitutes this counter electrode is formed with the comparatively high crystallinity. As will be described later, this light transmitting conductive layer has the relationship with the light transmitting conductive film TE1 that the light transmitting conductive film TE1 is simultaneously formed in the terminal portion at the time of forming the light transmitting conductive layer. This is attributed to the fact that the forming accuracy (for example, peeling off at the time of performing etching or the like) is not so strictly required. That is, as described above, the counter electrode CT is formed on the substantially whole region of the pixel region and has a large line width.

Further, between the respective neighboring gate signal lines GL, a counter voltage signal line CL is formed in parallel with the gate signal line GL and the counter voltage signal line CL is electrically connected to the counter electrode CT in a directly overlapped manner with the above-mentioned counter electrode CT. This is because that voltage is applied to the counter electrode CT via the counter voltage signal line CL.

Here, by simultaneously forming the above-mentioned signal lines GL with the formation of the counter voltage signal lines CL, the reduction of the manufacturing man-hours can be realized.

On the front surface of the transparent substrate SUB1 on which the counter electrodes CT, the gate signal lines GL and the counter voltage signal lines CL are formed in the above-mentioned manner, an insulation film GI made of SiN, for example, is formed in such a manner that the insulation film GI covers the counter electrode CT or the like.

This insulation film GI has a function of an interlayer insulation film against the above-mentioned signal line GL in the forming region of the drain signal line DL which will be described later and a function of a gate insulation film or the like in the forming region of the thin film transistor TFT which will be described later.

Here, on the front surface of this insulation film GI, a semiconductor layer AS which is made of, for example, amorphous Si is formed in such a manner that the semiconductor layer AS is overlapped to a portion of the above-mentioned gate signal line GL.

This semiconductor layer AS is a semiconductor layer AS of the thin film transistor TFT and, by forming a drain electrode SD1 and a source electrode SD2 thereon, it is possible to constitute a MIS type transistor having the inverse staggered structure in which a portion of the gate signal line is configured as a gate electrode.

Here, the above-mentioned drain electrode SD1 and the source electrode SD2 are simultaneously formed with the formation of the drain signal line DL.

That is, the drain signal lines DL which are extended in the x direction and are arranged in parallel in the x direction are formed and a portion thereof is extended to an upper surface of the above-mentioned semiconductor layer AS thus forming the drain electrode SD1. Further, the source electrode SD2 is formed in such a manner that the source electrode SD2 is spaced apart from the drain electrode SD1 by a length of channel of the thin film transistor TFT.

This source electrode SD2 is electrically connected with the pixel electrode PX which is formed on a protective film PAS which will be explained later and an end portion thereof is slightly extended to the inside of the pixel region thus constituting a contact portion.

The protective film PAS is formed on the transparent substrate SUB1 in a state that the protective film PAS also covers the above-mentioned thin film transistor TFT, wherein the protective film PAS is formed of a sequentially stacked body which is constituted of, for example, an organic material and an inorganic material. Using the protective film PAS, a direct contact between the thin film transistor TFT and the liquid crystal can be prevented.

Here, in each pixel region, on the above-mentioned protective film PAS, the pixel electrode PX is formed. This pixel electrode PX is formed of a light transmitting conductive layer such as, for example, ITO (Indium Tin Oxide), ITZO (Indium Tin Zinc Oxide), IZO (Indium Zinc Oxide), $SnO_2$ (tin oxide), $In_2O_3$ (indium oxide) or the like. The pixel electrode PX is constituted of a group of electrodes, wherein a plurality of strip-like electrodes which make an certain angle θ with respect to the gate signal line GL are arranged in parallel in the extending direction of the drain signal line DL.

Further, the respective electrodes of the electrode group are electrically connected by way of a conductive layer formed of the same material and are integrally formed in the peripheral portion of the pixel region.

Accordingly, the above-mentioned pixel electrode PX is formed as a pattern in which a plurality of slits which make an angle θ with respect to the gate signal line GL are formed in the conductive layer formed at the central portion except for the periphery of the pixel region in the extending direction of the drain signal line DL.

The respective electrodes of the pixel electrode PX which constitute the group of electrodes make the angle θ with respect to the gate signal line GL is provided to aim at a so-called multi-domain effect. When the multi-domain effect is not taken into consideration, the respective electrode may be arranged in parallel with the gate signal line GL or in parallel with the drain signal line DL.

Further, the pixel electrode PX is, in a portion of the periphery thereof, connected to the source electrode SD2 of the above-mentioned thin film transistor TFT through a through hole which is preliminarily formed in the protective film PAS below the electrode PX.

Here, the light transmitting conductive layer which forms the pixel electrode PX is formed with the relatively low crystallinity. As will be described later, the formation of the light transmitting conductive layer has the relationship with the light transmitting conductive film TE2 that the formation of the light transmitting conductive layer simultaneously forms the light transmitting conductive film TE2 in the terminal portion. This relationship is based on the fact that the forming accuracy (for example, peeling off at the time of performing the etching or the like) is strictly required. This is because, as mentioned above, the pixel electrode PX is constituted of a group of electrodes and formed in such a manner that the respective electrodes have a small line width.

Here, it is constituted that the plate-like pixel electrode having slits thereon is formed in such a manner that an outer profile thereof is displace from an outer profile of the above-mentioned counter electrode CT and hence, a portion of the peripheral portion of the counter electrode CT has a portion which is protruded from the pixel electrode PX and, in this portion, the counter electrode CT can be electrically connected with the counter electrode CT in the neighboring other pixel (the pixel neighboring in the extending direction of the drain signal line DL).

That is, in the respective neighboring pixel in the extending direction of the drain signal line DL, a conductive layer CB is mounted in such a manner that the conductive layer CB strides over a portion of the gate signal line GL and, for example, one end of the conductive layer CB on the lower pixel side in the drawing with respect to the signal line GL is connected to the counter electrode CT of the pixel via a through hole which passes through the protective film PAS, the insulation film GI below the conductive layer CL, while the other end of the conductive layer CB on the upper pixel side in the drawing with respect to the signal line GL is connected to the counter electrode CT of the pixel via the through hole which passes through the protective film PAS and the insulation film GI below the conductive layer CL.

For each one pixel, the conductive layers CB are formed on respective pixel sides which are respectively positioned in upper and the lower extending directions of the drain signal line DL and, accordingly, the counter electrodes CT of the respective pixels which are arranged in parallel in the y direction are electrically connected by using the above-mentioned conductive layer CD.

Here, this conductive film CB is formed of the same material as the pixel electrode PX and is simultaneously formed with the formation of the pixel electrode PX. This film formation is adopted to prevent the increase of the manufacturing man-hours.

Here, on the front surface of the transparent substrate SUB1 on which the pixel electrodes PX, the conductive films CB are formed in this manner, an orientation film AL is formed and, by using this orientation film AL, the initial orientation direction of molecules of the liquid crystal which are directly made into contact with the orientation film AL is defined.

Figure 1A:
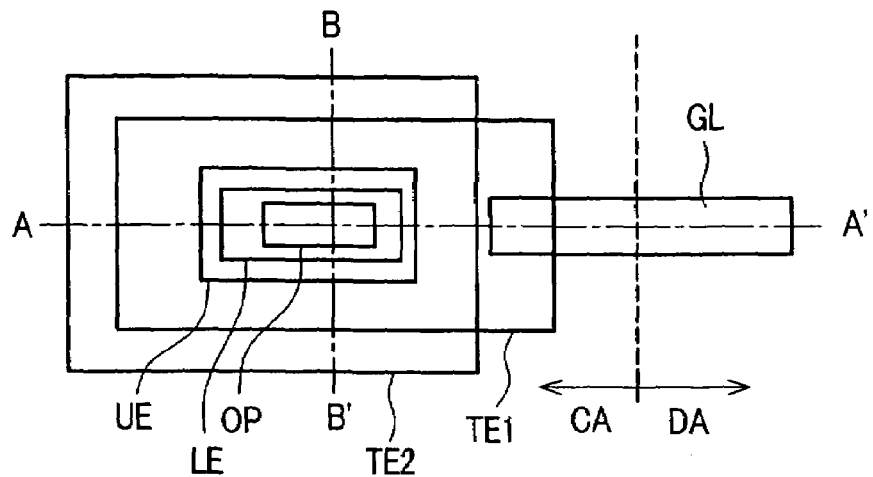

Further, a transparent substrate SUB2 which is arranged such that the transparent substrate SUB2 faces the above-mentioned transparent substrate SUB1 by way of the liquid crystal LC and, on the liquid crystal side surface of this transparent substrate SUB2, a black matrix BM is formed in such a-manner the black matrix BM covers respective thin film transistor TFT and, at the same time, defines the respective pixel regions. In FIG. 1A, the opening portions of the black matrix BM are drawn in such a manner that the opening portions thereof are overlapped.

Here, on the surface of the transparent substrate SUB2 on which the black matrix BM is formed, a color filter CF is formed in such a manner that the color filter covers the opening portion of the black matrix. This color filter CF is formed of a color filter of each color, for example, red (R), green (G), blue (B) for example, a red color filter is commonly formed in the group of respective pixel regions which are arranged in parallel in the y direction and the color filters are commonly formed in the order such as green (G), blue (B), red (R), . . . in the group of the pixel regions which are sequentially neighboring to the group of pixel regions in the x direction.

Further, the orientation film AL is formed in such a manner that the orientation film covers also the color filter CF. This orientation film AL is a film which is directly brought into contact with the liquid crystal and defines the initial orientation direction of the molecules of the liquid crystal.

Figure 1B:
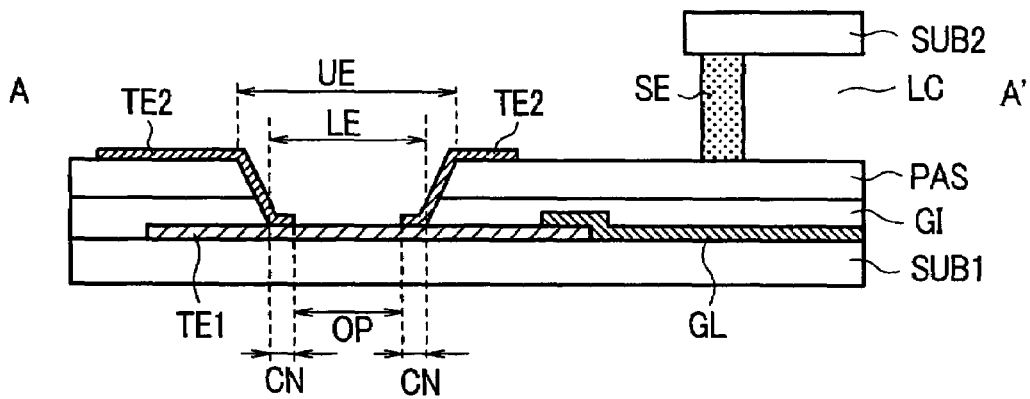
Figure 1C:
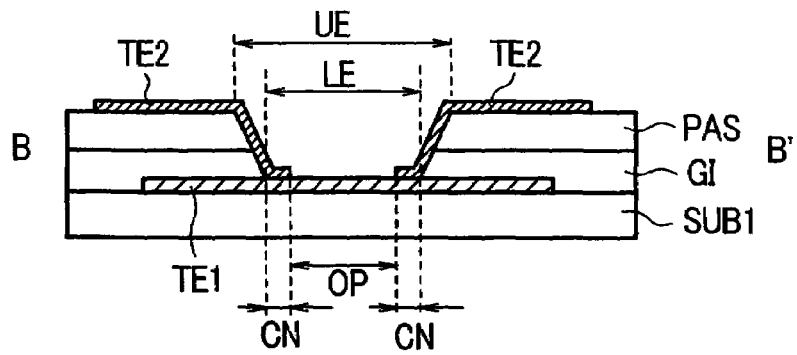

FIG. 1A is a plan view showing one embodiment of the structure of a terminal, for example, in the above-mentioned gate signal line GL. Further, FIG. 1B is a cross-sectional view taken along a line A-A' of FIG. 1A, FIG. 1C is a cross-sectional view taken along a line B-B' of FIG. 1A.

In the forming region of the above-mentioned terminal portion of the transparent substrate SUB1, a light transmitting conductive film TE1 having a larger area than the forming region of the terminal portion is formed. This light transmitting conductive film TE1 is simultaneously formed, for example, with the formation of the counter electrode CT which is formed in the above-mentioned pixel region.

Further, as the light transmitting conductive film TE1, the light transmitting conductive film TE1 which is formed to have the low crystallinity (at least lower than the crystallinity of the light transmitting conductive film TE1 which will be described later) is used. Here, that the low crystallinity implies that the light transmitting conductive film TE1 has small particles or has small unevenness on the surface of the light transmitting conductive film TE1.

The gate signal line GL which is led to the conductive film TE1 side is electrically connected to the conductive film TE1 by forming an end part thereof in an overlapping manner with the conductive film TE1. Here, in this embodiment, the end portion of the gate signal line GL is formed such that the end portion of the gate signal line GL extends until just before the terminal portion and does not reach at the terminal portion.

In the sequentially stacked body of the insulation film GI and the protective film PAS formed such that the sequentially stacked body covers these conductive film TE1 and the gate signal line GL, a hole opening is performed in the portion corresponding to the above-mentioned terminal portion and by using this hole opening, a portion of the above-mentioned conductive film TE1 is exposed. These insulation film GI and the protective film PAS are formed by directly extending portions thereof formed in the liquid crystal display part AR.

Here, in the opening portion formed in the sequentially stacked body of the insulation film GI and the protective film PAS, a light transmitting conductive film TE2 is formed. This conductive film TE2 is simultaneously formed, for example, with the formation of the pixel electrode PX in the above-mentioned pixel region.

Further, as the light transmitting conductive film TE2, the light transmitting conductive film TE2 formed to have the high crystallinity (at least lower than the crystallinity of the above-mentioned light transmitting conductive film TE1) is used. Here, the low crystallinity implies that the light transmitting conductive film TE2 is observed as a film having the large particle size and large unevenness on a surface thereof.

This conductive film TE2 is formed from the peripheral portion from which the central portion of the conductive film TE1 exposed from the above-mentioned opening portion is left to the side wall surface of the opening portion of the above-mentioned stacked body, the front surface in the periphery of the opening portion of the above-mentioned stacked body.

Accordingly, in the above-mentioned terminal portion, the portion which functions as the terminal thereof is constituted by the conductive film TE2 having the conductive film TE1 exposed in the center thereof in a planar view. That is, as shown in FIG. 1B or FIG. 1C, in the inside of the opening portion of the above-mentioned stacked body, the conductive film TE1 is exposed in the central OP portion of the opening portion and the conductive film TE2 is formed in the periphery CN in an overlapped manner with the above-mentioned conductive film TE1.

With respect to the terminal portion which is constituted in this manner, the conductive films thereof are the light transmitting conductive film TE1 and light transmitting conductive film TE2 and a material having reliability against a so-called electrolytic corrosion is used in both of them.

Here, with respect to the conductive film TE2 which is used as the upper layer, to take the connection resistance generated between the conductive film TE2 and the other electrode which is brought into direct contact with the conductive film into consideration, it is suitable to use the conductive film having the high crystallinity. This is because that the conductive film having the high crystallinity exhibits the low connection resistance.

However, from the reason set forth below, the conductive film having the high crystallinity is used as the conductive film TE1 which is positioned below the conductive film TE2 and the conductive film TE2 is formed to have the crystallinity lower than the crystallinity of the conductive film TE1.

Here, in a portion of the region which functions as the terminal portion, the conductive film TE1 is configured to be exposed from the conductive film TE2 and, the exposed conductive film TE1 also contributes to the connection with the other electrode.

On the other hand, since the upper conductive film TE2 is formed to have the low in crystallinity, the upper conductive film TE2 has the hardly peelable property and can form a reliable terminal portion and, at the same time, at the peeling of other electrode such as repairing or the like, for example, the occurrence of the rupture of the terminal portion can be prevented.

Further, when the conductive film TE2 is formed as the terminal portion of the display device, there is a step in which the semiconductor element such as the thin film transistor TFT or the like, for example, is formed between the conductive film TE1 and the conductive film TE2 and it is favorable to perform the forming of the conductive film TE2 at the low temperature. Accordingly, a conductive film having a low crystallinity which can be formed in the low temperature is used as the conductive film TE2.

Here, FIG. 5 shows a graph obtained by the X ray diffraction method (XRD) in the conductive film TE1 and TE2, wherein (a) shows a light transmitting conductive film TE1 having a high crystallinity and (b) shows a light transmitting conductive film TE2 having a low crystallinity. In each graph, the axis of abscissas shows a diffraction angle and the axis of ordinates shows a diffraction line strength.

Figure 5A:
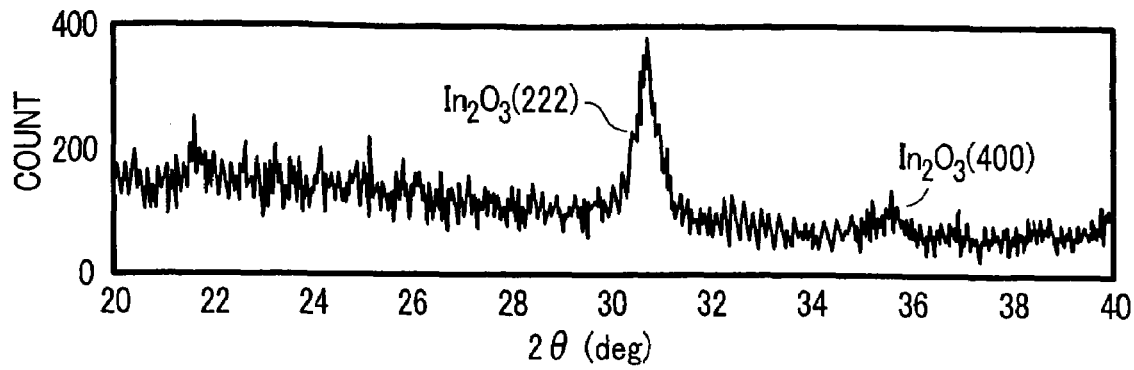
Figure 5B:
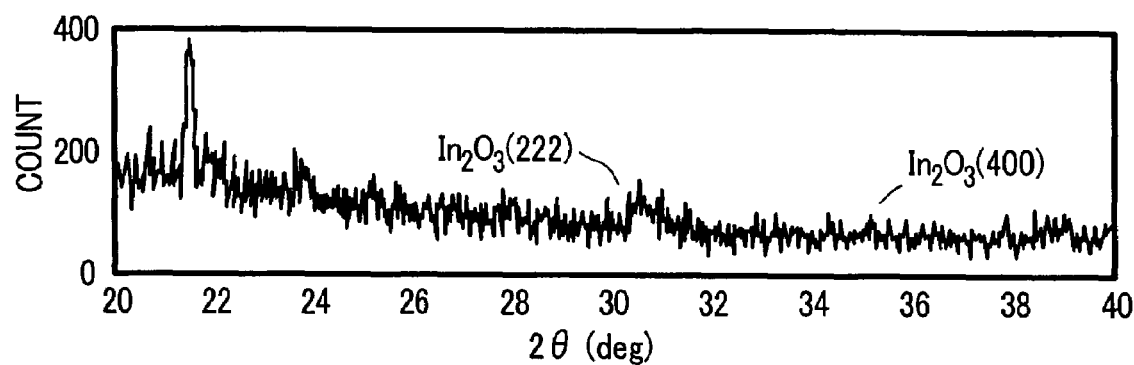

It is clearly understood from FIG. 5A and FIG. 5B, the light transmitting conductive film TE1 having the high crystallinity has a (222) peak of $In_2O_3$ relatively higher than the peak of the light transmitting conductive film TE2 and, further, the (400) peak of $In_2O_3$ with respect to the noise level of the background is relatively higher than the conductive film TE1 having the low crystallinity.

Figure 6:
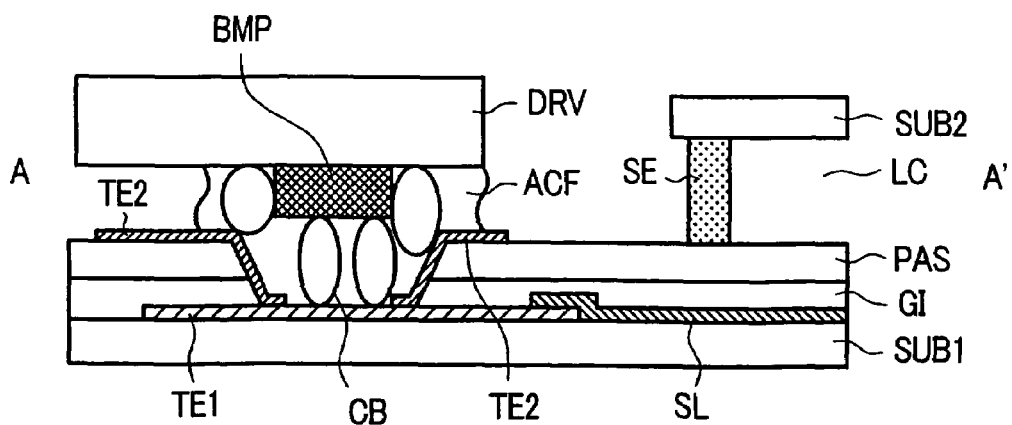
FIG. 6 is a cross-sectional view showing a connection portion between a semiconductor chip which constitutes a driver of the terminal portion of the display device according to the present invention with a bump electrode.

FIG. 6 corresponds to FIG. 1B and is a cross-sectional view showing that the bump electrode BMP of the DRV which is constituted of a semiconductor device mounted on the transparent substrate SUB1 is electrically connected to the terminal portion via the anisotropic conductive film ACF. The anisotropic conductive film ACF is constituted of a resin film in which fine conductive particles CB are included in a scattering manner and the electrical connection between the bump electrode BMP and the terminal portion (conductive film TE1, TE2) is made by way of the conductive particles CB.

It is obvious from the above-mentioned description that the conductive particles CB of the anisotropic conductive film ACF are made contact with the light transmitting conductive film TE1 (comparatively low in the crystallinity) out of the terminal portion and the contact resistance can be reduced at the contact portion.

Figure 7A:
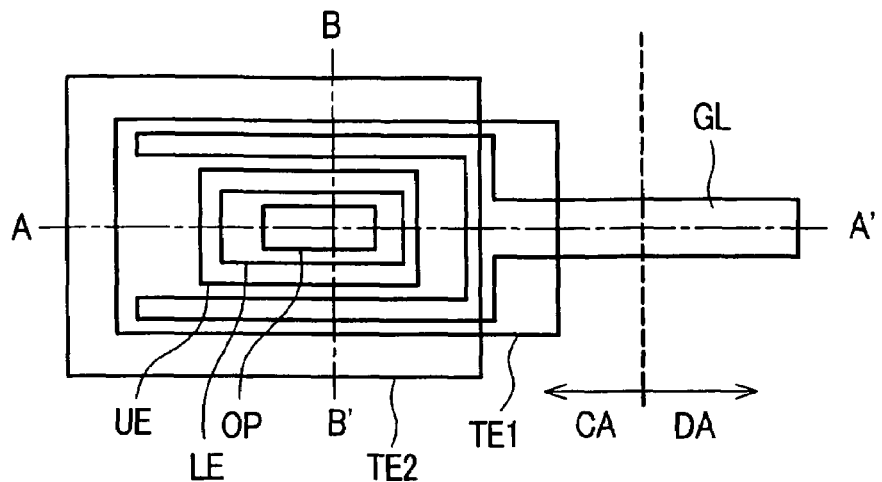
Figure 7B:
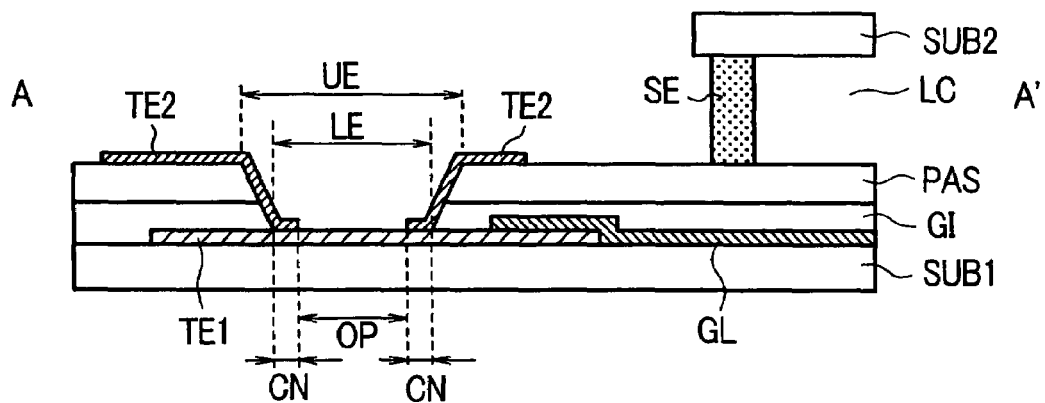
Figure 7C:
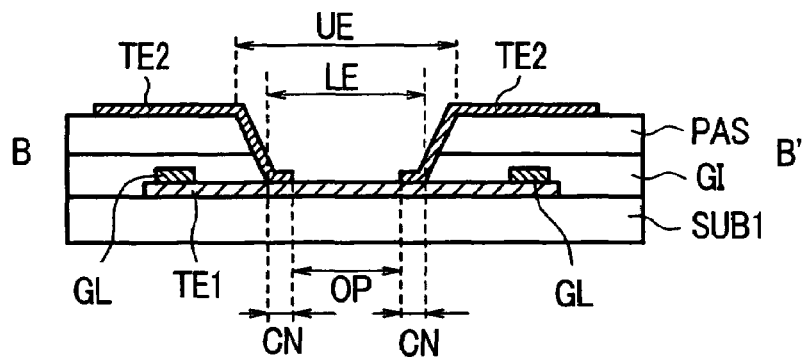

FIG. 7A to FIG. 7C are views showing another embodiments of the constitution of the above-mentioned terminal portion and respectively corresponding to FIG. 1A to FIG. 1C.

The constitution shown in FIG. 7A to FIG. 7C differs from the constitution shown in FIG. 1A to FIG. 1C in the pattern of the electrical connection portion between the gate signal line GL and the conductive film TE1.

That is, the terminal portion of the gate signal line GL is formed such that the terminal portion is branched in two and these respective branched portions have the terminal portions positioned therebetween and stacked on the conductive film TE1.

To reduce the electrical connection resistance between the gate signal line GL and the conductive film TE1, it is constituted that the area of the direct connection interface is made large. From this point, it is needless to say that it may be constituted such that the end portion of the gate signal line GL is formed in a circle and the terminal portion is positioned in the inside of this circle and, at the same time, stacked on the conductive film TE1.

In other words, by forming the above-mentioned gate signal line GL in such a manner that the gate signal line GL extends to at least a part of the circle region which surround the opening film PAS and the insulation film GI, the connection resistance can be reduced according to the extended length.

Figure 8A:
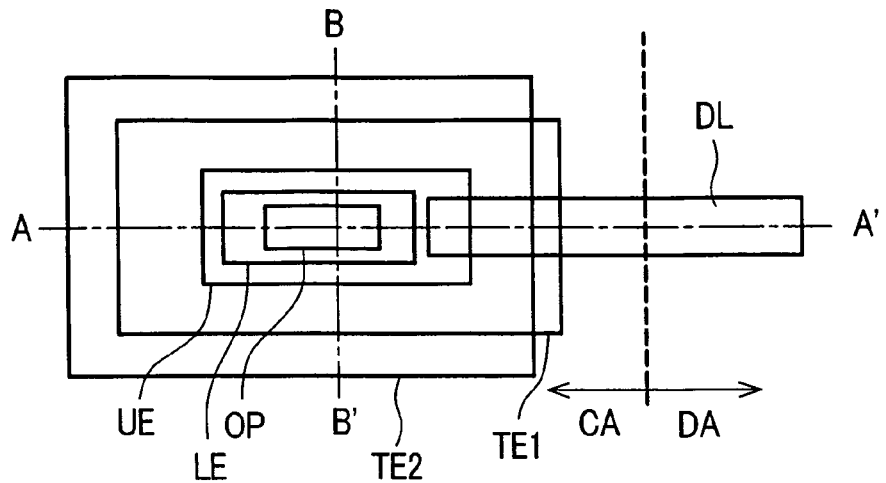
Figure 8B:
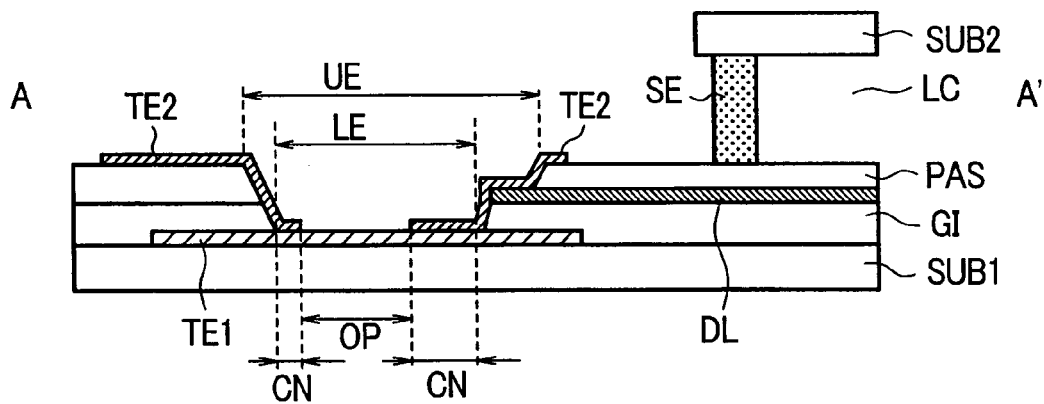
Figure 8C:
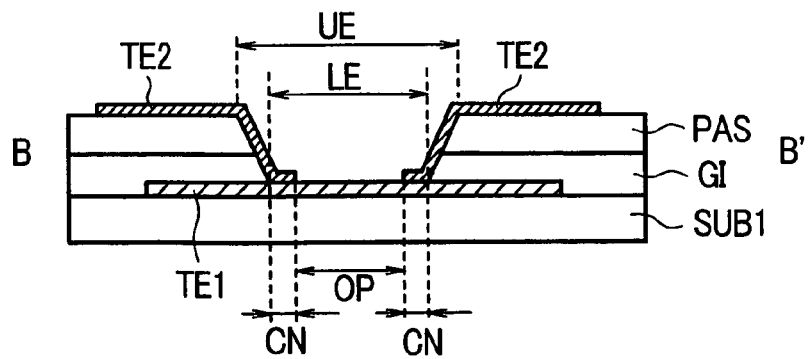

FIG. 8A to FIG. 8C are views showing another embodiment of the constitution of the above-mentioned terminal portion and respectively correspond to FIG. 1A to FIG. 1C.

The constitution shown in FIG. 8A to FIG. 8C differs from the constitution shown in FIG. 1A to FIG. 1C as follows. That is, as shown in FIG. 8B, the signal line SL which is connected to the terminal portion is positioned between the insulation film GI and the protective film PAS and this end portion of the signal line SL is extended until the end portion is exposed in the side wall surface of the opening portion of the stacked body constituted of the insulation film GI and the protective film PAS and, at the same time, are electrically connected to the conductive film TE2 which is formed in such a manner that the conductive film TE2 covers the side wall surface.

In this case, to sufficiently ensure the electrical connection between the signal line SL and the conductive film TE2, in the above-mentioned opening portion, in the portion of the protective film PAS in which the signal line SL is extended, a sufficient stepped portion is formed with respect to the insulation film GI and hence, the surface of the signal line SL is exposed from the protective film PAS in a comparatively large area in this stepped portion. The electrical connection between the conductive film TE2 which is formed in such a manner that the conductive film TE2 covers the opening portion and the above-mentioned signal line SL can be sufficiently assured.

Here, as this signal line SL, for example, a drain signal line DL can be adopted in the constitution having pixels shown in FIG. 4.

Figure 9A:
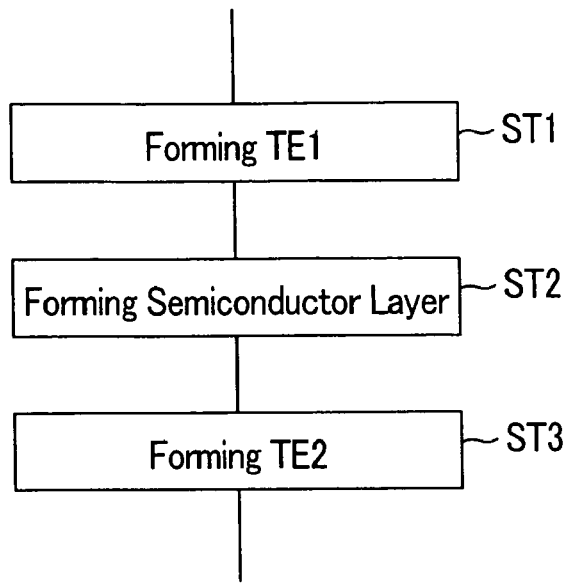
FIG. 9A and FIG. 9B are extracted flow charts showing an embodiment of a manufacturing method of the terminal portion of the display device according to the present invention.

FIG. 9A, in the steps of one embodiment of the manufacturing method of the liquid crystal display device, shows the film forming (step ST1) of the light transmitting conductive film TE1 and the film forming of the semiconductor layer which is formed thereafter and the film forming (step ST3) of the light transmitting conductive film TE2 in an extracted manner.

In step ST1, the light transmitting conductive film TE1 is formed as the light transmitting conductive film having a high crystallinity.

This can be realized by adopting the high temperature or the like as one process condition, for example. In step ST2, although the semiconductor layer is formed, since the formation of the light transmitting conductive film TE1 has been completed, the semiconductor layer can be formed with a desired property irrespective of the film forming condition of the conductive film TE1.

In step ST3, the light transmitting conductive film TE2 is formed, however, the semiconductive layer is already formed. To prevent the deterioration of the property of this semiconductor layer, the light transmitting conductive film TE2 is formed as a film having the lower crystallinity than the conductive film TE1. Accordingly, the light transmitting conductive film TE2 may be made as amorphous. Further, by lowering the film forming temperature than the film forming temperature for the formation of the light transmitting conductive film TE1, the conductive film TE2 may be formed to have a lower crystallinity than the light transmitting conductive film TE1.

Figure 9B:
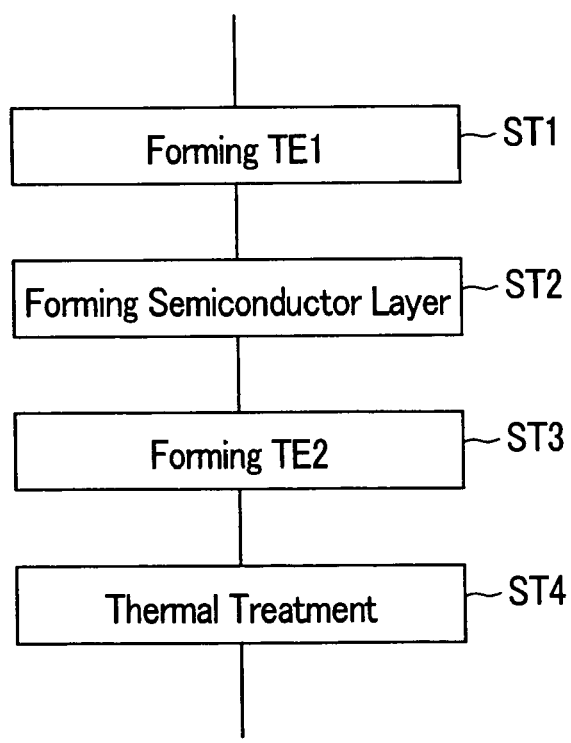

FIG. 9B, in the step of another embodiment of the manufacturing method of the liquid crystal display device, shows the film forming (step ST1) of the light transmitting conductive film TE1, the film forming (step ST2) of the semiconductor layer which is performed thereafter, the film forming (step ST3) of the light transmitting conductive film TE2 and the thermal treatment (step ST4) in an extracted manner.

The step ST1 to the step ST3 are same as the step ST1 to the step ST3 in FIG. 9A and the constitution of FIG. 9B differs from the constitution of FIG. 9A in that the heat treatment is applied thereafter.

This is because that, using this heat treatment, the crystallinity of the light transmitting conductive film TE2 is enhanced and the reduction of the connection resistance can be realized. It is preferable that the temperature of this heat treatment is, to prevent the heat treatment from adversely influencing the semiconductor layer, equal or less than approximately 250° C. Alternatively, to realize the enhancement of the crystallinity of the light transmitting conductive film TE2, the temperature of the heat treatment is favorably equal to or more than 150° C.

Here, the step of this heat treatment may be formed in the manufacturing step of the thin film transistor TFT or may be also used as the other manufacturing step of the liquid crystal display device.

For example, as one embodiment, it is favorable to combine the heat treatment step with the baking step of the orientation film AL. In manufacturing the orientation film AL, there is a case in which the liquid orientation film is usually applied to the transparent substrate SUB1 and, thereafter, an orientation film baking step is formed to dry and solidify the liquid orientation film. In this orientation film baking, by setting the temperature to a value equal to or more than 150° and less than 250°, the heat treatment for enhancing the crystallinity of the light transmitting conductive film TE2 and the orientation film baking step are performed simultaneously.

Further, when the heat treatment step is combined with the orientation film baking step in this manner, to effectively obtain both of the object of the orientation film baking and the enhancement of the crystallinity of the light transmitting conductive film TE2, it is favorable to set the highest temperature during the step to a value equal to or more than 180° C. and less than 240° C.

The above-described respective embodiments may be used in a single form or in combination. This is because that the advantageous effects of the respective embodiments can be realized individually or synergistically.

What is claimed is:

1. A manufacturing method of a display device comprising the steps of:

forming a first transparent conductive film on a terminal portion forming region of a substrate;

forming an insulation film on at least the first transparent conductive film;

forming a semiconductor layer on a region of the substrate other than the terminal portion forming region;

forming a protective film on the insulation film;

exposing a portion of the first transparent conductive film in the terminal portion forming region of the substrate;

forming a second transparent conductive film on a part of the exposed first transparent conductive film, a part of the insulation film and a part of the protective film; and performing a thermal treatment on the second transparent conductive film.

2. A manufacturing method according to claim 1, wherein the step in which the thermal treatment is performed is conducted also for an orientation film baking step.

3. A manufacturing method according to claim 1, wherein a highest temperature of the thermal treatment is in a range from 150° C. to 250° C.

* * * * *